(12) United States Patent
Watanabe

(10) Patent No.: US 6,715,119 B1
(45) Date of Patent: Mar. 30, 2004

(54) TEST DATA GENERATING SYSTEM AND METHOD TO TEST HIGH-SPEED ACTUAL OPERATION

(75) Inventor: Hitoshi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 482 days.

(21) Appl. No.: 09/612,387

(22) Filed: Jul. 7, 2000

(30) Foreign Application Priority Data

Jul. 7, 1999 (JP) ............................................. 11-193707

(51) Int. Cl.[7] .............................................. G01R 31/28
(52) U.S. Cl. ...................................... 714/741; 714/744
(58) Field of Search ................................. 714/738, 741, 714/742, 31, 32, 33, 724, 739, 740, 726, 727, 728, 729, 30; 703/13, 14, 19, 21, 22, 15, 23

(56) References Cited

U.S. PATENT DOCUMENTS

| | | | | |
|---|---|---|---|---|
| 5,719,881 A | * | 2/1998 | Yonetoku | 714/25 |
| 6,205,559 B1 | * | 3/2001 | Sakaguchi | 714/25 |
| 6,219,809 B1 | * | 4/2001 | Noy | 714/724 |
| 6,237,117 B1 | * | 5/2001 | Krishnamoorthy | 714/724 |

* cited by examiner

Primary Examiner—Christine T. Tu
(74) Attorney, Agent, or Firm—Staas & Halsey LLP

(57) ABSTRACT

A test data generating system and method to conduct high-speed operation (actual operation test of an LSI using a tester. The system converts existing simulation data to high-speed operation verifying test data which is formed to obtain a predetermined output expectation value after a clock signal is stopped for a predetermined period. The test data generating system includes a selecting device to select first output expectation values from simulation data and an inserting device to insert output expectation values, which are identical to a predetermined number of the first expectation values, after the first output expectation values. The system also inserts an input pattern, which is identical to a predetermined number of the input patterns, after the input pattern corresponding to the first output expectation value. A replacing device replaces the predetermined output expectation values of the simulation data with third output expectation values, and a setting device sets the first output expectation values to second output expectation values determined from the simulation data based on the predetermined number or the third output expectation values.

24 Claims, 13 Drawing Sheets

TEST DATA GENERATING SYSTEM AND METHOD TO TEST HIGH-SPEED ACTUAL OPERATION

CROSS REFERENCE TO RELATED APPLICATIONS

This application is based upon and claims priority of Japanese Patent Application No. 11-193707, filed Jul. 7, 1999, the contents being incorporated herein by reference.

BACKGROUND OF THE INVENTION

1. Field of the Invention

The present invention relates to a large-scale-integrated circuit (LSI) test data generating system and method. More particularly, the present invention relates to a test data generating system to perform testing of high-speed operation (actual operation) of an LSI with automatic test equipment (ATE) using high-speed operation verifying test data.

2. Description of the Related Art

Various LSI testing techniques are known. For example, a "function test" technique is known in which the operation of the LSI is tested by directly using a function test pattern (i.e., a test pattern for simulation) for automatic test equipment (ATE).

An advantage of the function test technique is that generation of a new test circuit and a new test pattern are not required because the test pattern which is used for simulation is used directly. A disadvantage of the function test technique is that is impossible to realize a high-speed test (actual operation) because delay of input signals and output signals becomes large as a result of the capacitance of a probe pin and a board on the tester. In particular, the input signal and output signal are dulled to a large extent.

Another conventional LSI testing technique is the BIST technique. The BIST technique tests operation of an LSI device using a data generator and a data compressor built into a chip. A circuit to be tested is arranged between the data generator and the data compressor. Data is input to the circuit to be tested from the data generator and the data compressor receives an output from the circuit to be tested.

High speed operation (actual operation) can be tested using the BIST technique by setting an input clock signal to the clock signal of the high-speed operation (actual operation). Moreover, the data compressor allows the test to be made efficiently.

However, when using the BIST technique, the entire circuit is defined as the test object. Therefore, a test must be conducted for the entire circuit, even for the part of the circuit which does not require the test. As a result, the time required to perform the test increases. The part of the circuit which does not require the test is, for example, a part which does not require the high-speed operation (actual operation) test and a part to which a plurality of flip-flop (FF) circuits are connected. For these parts which do not require the test, it is adequate to latch data with the final-stage FF circuit, and therefore an accurate timing margin is not required for the FF circuits of the stages other than the final stage. Moreover, when using the BIST technique, chip area increases because the data generator and data compressor must be built into the chip.

Another LSI testing technique is the "path test" technique. According to the path test technique, the setup timing and hold timing among flip-flop (FF) circuits are verified by using FF circuits for scanning. By operating the FF circuit for scanning to which a predetermined value is set, it can be verified whether or not data is latched accurately in the FF circuit for scanning in the next stage.

The path test technique allows high-speed operation (actual operation) to be tested by operating the FF circuit for scanning with a clock signal corresponding to the high-speed operation (actual operation). However, because a large number of paths are provided among FF circuits, the time required for testing increases, and it is impossible to test the paths among all FF circuits. Moreover, the chip area increases because the chains of FF circuits for scanning the data must be built into the chip.

Yet another LSI circuit testing technique performs testing using a ring oscillating circuit. More specifically, the LSI operation test is conducted by providing a ring oscillating circuit within a chip. Operations of the LSI circuit can be verified by obtaining an output result of the LSI in synchronization with an output frequency of the ring oscillating circuit.

Testing using the ring oscillating circuit allows high-speed operation (actual operation) to be tested by setting the output frequency of the ring oscillating circuit to the frequency of the high-speed operation.

However, the ring oscillating circuit test is an indirect LSI operation test because the LSI operation test is not conducted with the clock signal supplied to the LSI. Specifically, operation of the LSI is only verified from the external side in synchronization with the output frequency of a ring oscillating circuit. Moreover, the chip area also increases because the ring oscillating circuit must be built into the chip.

Thus, in summary, the conventional LSI testing techniques result in the following problems: (1) the function test technique does not allow high-speed operation (actual operation) to be tested with the tester (ATE). Moreover, even when the high-speed operation (actual operation) can be tested without use of a tester (ATE), (2) the test time increases, and (3) the chip area increases.

Therefore, an LSI testing technique is needed which can test high-speed operation (actual operation) without resulting in an increase in test time and chip area.

SUMMARY OF THE INVENTION

It is an object of the present invention to provide an LSI circuit testing system and method which overcomes the above-noted problems of the conventional testing techniques.

Objects and advantages of the present invention are achieved in accordance with embodiments of the present invention with a selecting device to select a first output expectation value corresponding to an input value from simulation data; an inserting device to insert a predetermined number of output expectation values, which are identical to the first output expectation value, after the first output expectation value, and to insert a predetermined number of input values, which are identical to the input value, after the input value corresponding to the first output expectation value; a replacing device to replace the predetermined number of output expectation values of the simulation data with third output expectation values; and a setting device to set the first output expectation value to a second output expectation value determined from the simulation data based on the predetermined number or the third output expectation values.

In accordance with embodiments of the present invention, the predetermined number is a number of cycles during which a clock signal is stopped.

In accordance with embodiments of the present invention, the third output expectation value is a don't care pattern.

In accordance with embodiments of the present invention, the number of cycles to stop the clock signal is determined based on capacitance of elements of a tester.

In accordance with embodiments of the present invention, the number of cycles to stop the clock signal is determined on the basis of the operating conditions of an LSI.

In accordance with embodiments of the present invention, the first output expectation value is selected for every predetermined cycle.

In accordance with embodiments of the present invention, the second output expectation value corresponds to a last cycle in the number of cycles during which the clock signal is stopped.

In accordance with embodiments of the present invention, the test data generating system further comprises a strobe timing generating device to generate a strobe timing to set an output expectation value for the selected output expectation value, wherein the strobe timing is set after the leading edge of the clock signal.

In accordance with embodiments of the present invention, the second output expectation value corresponds to clock cycles after the number of clock cycles during which the clock signal is stopped.

In accordance with embodiments of the present invention, the test data generating system further comprises a strobe timing generating device to generate a strobe timing to set an output expectation value for the selected output expectation value, wherein the strobe timing is set before the leading edge of the clock signal.

Objects and advantages of the present invention are achieved in accordance with embodiments of the present invention with a semiconductor integrated circuit, comprising a high-speed operation verifying control terminal; and a system clock control circuit to stop a clock signal for a predetermined period based on a control signal input to the high-speed operation verifying control terminal, wherein a test is conducted on a tester with test data which is formed to obtain a predetermined output expectation value after the clock signal is stopped for the predetermined period.

Objects and advantages of the present invention are achieved in accordance with embodiments of the present invention with a test data generating system, comprising means for selecting a first output expectation value from simulation data, the first output expectation value corresponding to an input value; means for inserting a predetermined number of output expectation values, which are identical to the first output expectation value, after the first output expectation value; means for inserting a predetermined number of input values, which are identical to the input value, after the input values corresponding to the first output expectation value; means for replacing the predetermined number of output expectation values of the simulation data with third output expectation values; and means for setting a second output expectation value determined from said simulation data to said first output expectation value based on the predetermined number or said third output expectation values.

Objects and advantages of the present invention are achieved in accordance with embodiments of the present invention with a computer readable storage medium encoded with processing instructions for implementing a test data generating method with a computer, the method comprising selecting a first output expectation value from simulation data, the first output expectation value corresponding to an input value; inserting a predetermined number of output expectation values, which are identical to the first output expectation value, after the first output expectation value; inserting a predetermined number of input values, which are identical to the input value, after the input values corresponding to the first output expectation value; replacing the predetermined number of output expectation values of the simulation data with third output expectation values; and setting a second output expectation value determined from said simulation data to said first output expectation value based on the predetermined number or said third output expectation values.

Objects and advantages of the present invention are achieved in accordance with embodiments of the present invention with a test data generating method, comprising selecting a first output expectation value from simulation data, the first output expectation value corresponding to an input value; inserting a predetermined number of output expectation values, which are identical to the first output expectation value, after the first output expectation value; inserting a predetermined number of input values, which are identical to the input value, after the input values corresponding to the first output expectation value; replacing the predetermined number of output expectation values of the simulation data with third output expectation values; and setting a second output expectation value determined from said simulation data to said first output expectation value based on the predetermined number or said third output expectation values.

In accordance with the present invention, the test data generating system provides easy testing of high-speed operation (actual operation) of an LSI using automatic test equipment (ATE) without resulting in an increase of test time and chip area.

In accordance with the present invention, the following advantageous effects are attained. A high-speed operation (actual operation) test can be conducted with the tester (ATE) using high-speed operation verifying test data which takes into considered delay of input signals and output signals as a result of capacitance of a probe pin and a board of the tester. Because only the pattern for simulation is converted to the high-speed operation verifying test data, the data for testing high-speed operation (actual operation) can be obtained easily and the test period can also be reduced. Further, because a chip in accordance with the present invention comprises only a system clock control circuit for controlling the clock signal and a high-speed operation verifying control terminal (clock enable terminal), test can be conducted without increasing the chip area.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DESCRIPTION OF THE PREFERRED EMBODIMENTS

Figure 1:
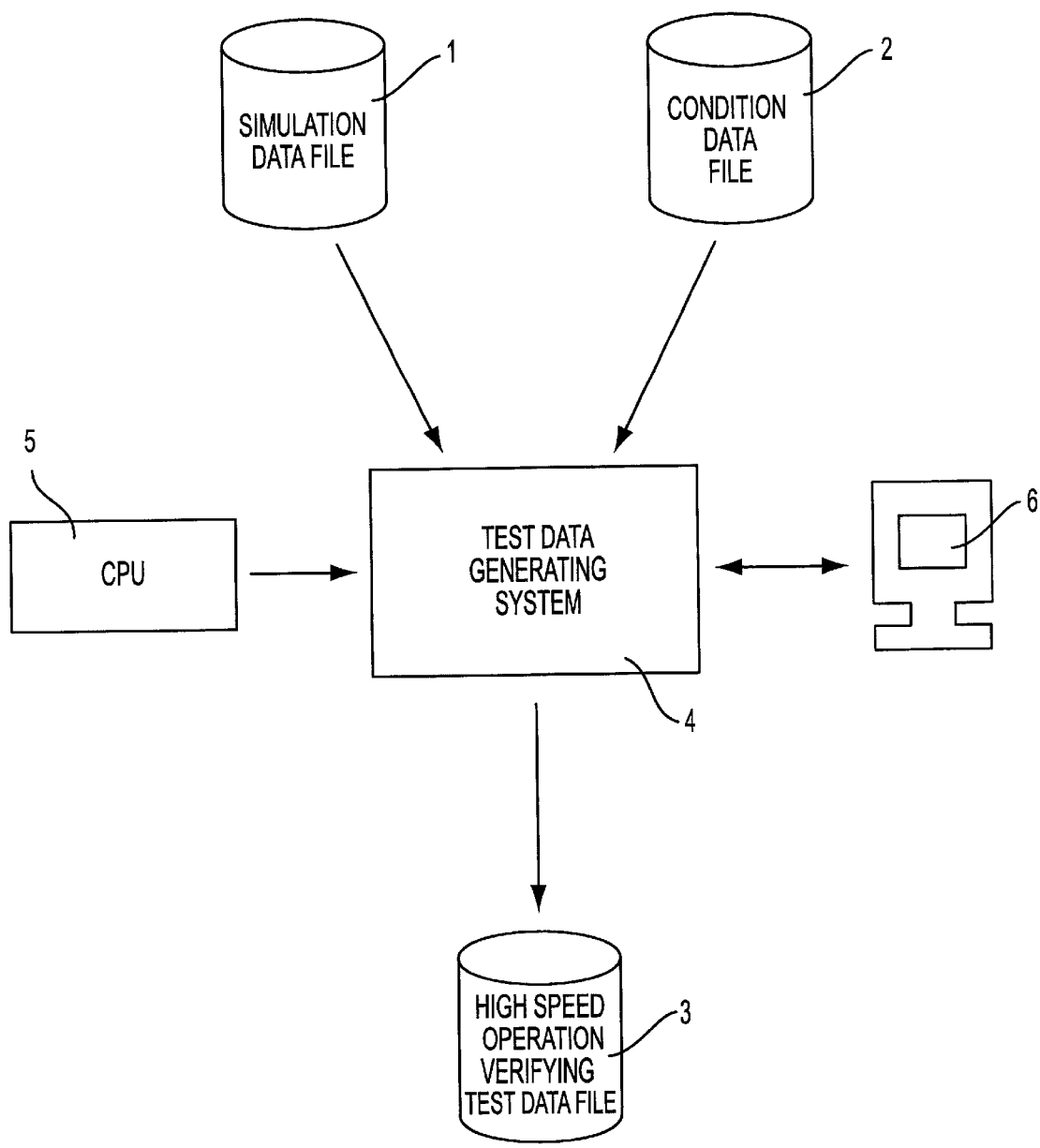
FIG. 1 is a block diagram of a test data generating system in accordance with embodiments of the present invention.

Reference will now be made in detail to the preferred embodiments of the present invention, examples of which are illustrated in the accompanying drawings, wherein like reference numerals refer to like elements throughout.

A test data generating system and method in accordance with embodiments of the present invention will be described first below with reference to FIGS. 1–3.

FIG. 1 is a block diagram of a test data generating system for generating high-speed operation verifying test data based on simulation data for an LSI in accordance with embodiments of the present invention. As shown in FIG. 1, a simulation data file 1 and a condition data file 2 are input to a test data generating system 4, a process cycle is performed under the control of a CPU 5, and high-speed operation verifying test data is output to a high-speed operation verifying test data file 3. Moreover, in accordance with the test data generating system 4 of the present invention, a dialog with a designer is possible through an image displayed on a display 6.

Furthermore, embodiments of the present invention may be achieved with a computer readable storage medium, such as semiconductor memory (RAM, ROM), floppy disk (FD), hard disk (HD), optical disk (CD, DVD), magneto-optical disk (MO, MD), magnetic tape or the like, encoded with processing instructions to implement a test data generation method.

Figure 2:
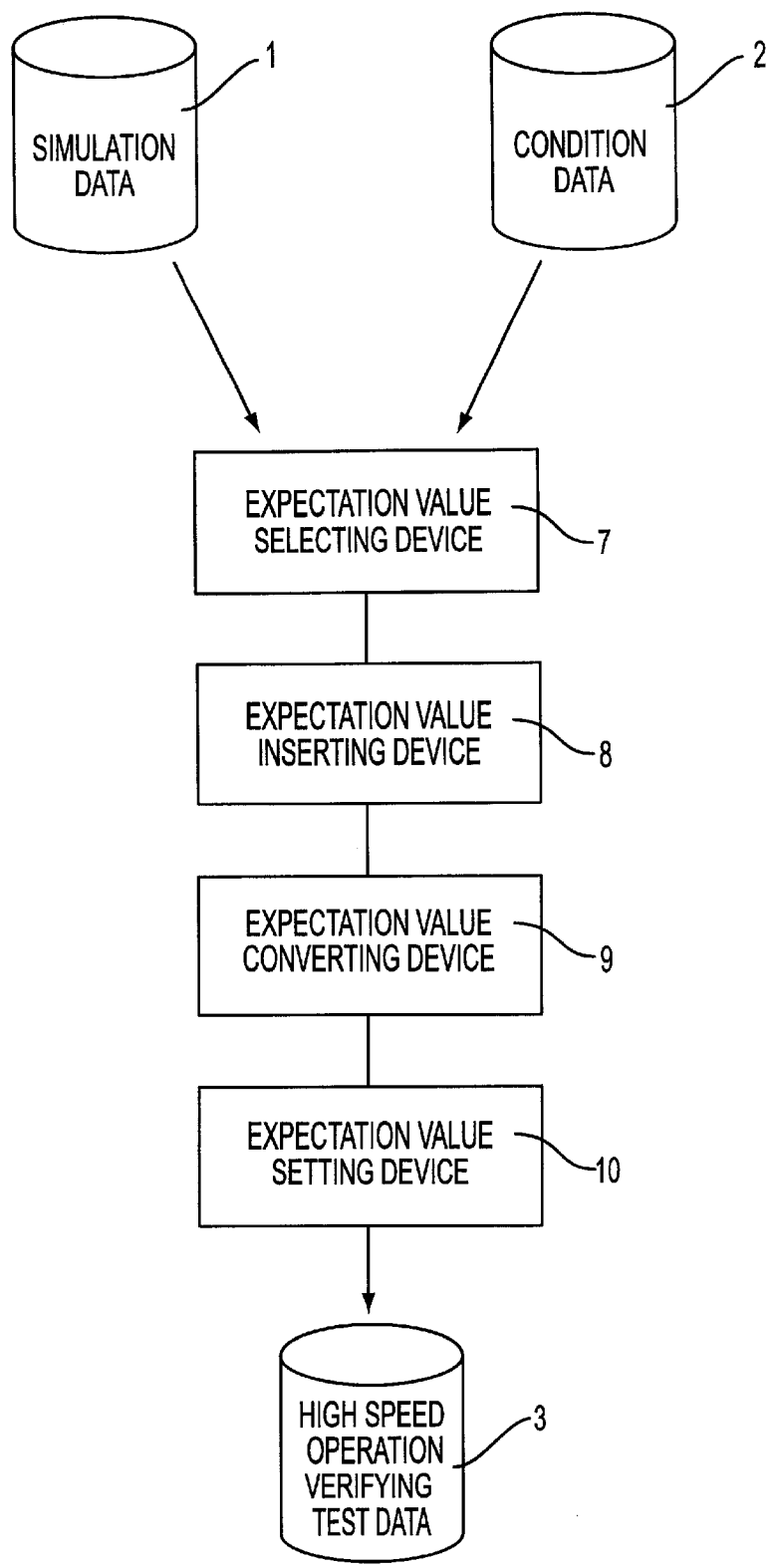
FIG. 2 is an explanatory diagram of operation of the test data generating system in accordance with embodiments of the present invention.

FIG. 2 is an explanatory diagram of the operation of the semiconductor test data generating system for generating high-speed operation verifying test data based on the simulation data for an LSI in accordance with embodiments of the present invention.

As shown in FIG. 2, simulation data 1 and condition data 2 are input to the semiconductor test data generating system. The simulation data 1 is data for simulation of the LSI. The contents of the simulation data 1 in accordance with embodiments of the present invention will be described in more detail hereinbelow. The condition data 2 is condition data for generating high-speed operation verifying test data. The condition data 2 is required to determine a degree of delay between input of an input signal and output of an output signal resulting from the input of the input signal. The condition data 2 includes at least the following two kinds of information: (1) information about the capacitance of probe pins and a board on the tester; and (2) information about operating conditions, such as temperature, process, power supply voltage, or the like.

The information about the capacitance of the probe pins and board is required to determine an amount of delay (amount of dullness) between an input signal and an output signal as a result of the capacitance of the probe pin and board on the tester. The information about operating conditions is required to determine the amount of delay of signal propagation within the LSI.

Figure 3:
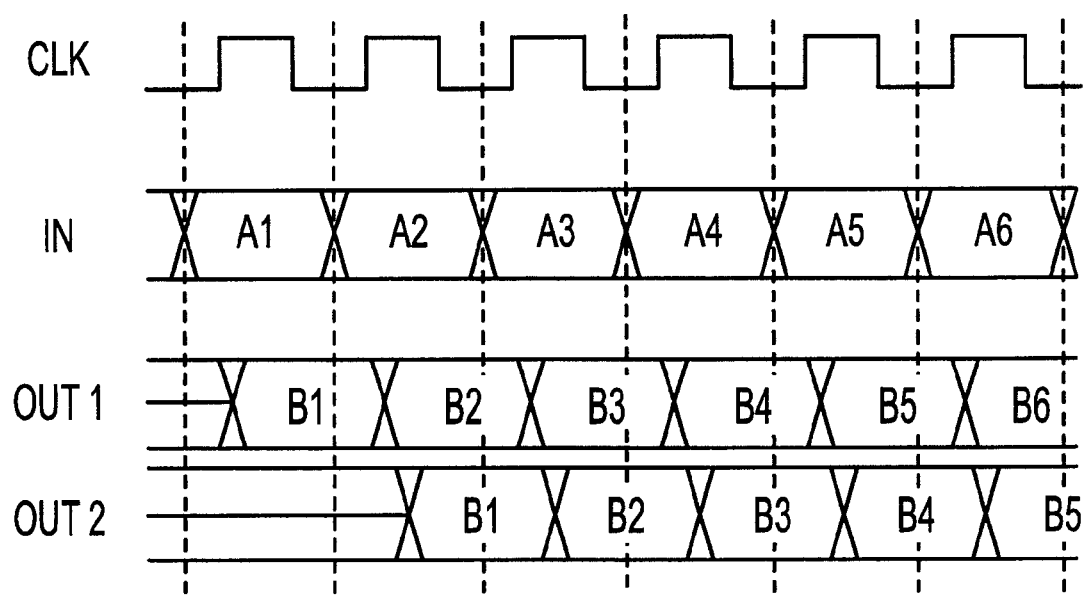
FIG. 3 is a timing diagram illustrating how delay between input data and output data differs depending on condition data in accordance with embodiments of the present invention.

FIG. 3 is a timing diagram illustrating how delay bewteen input data and output data differs depending on condition data, in accordance with embodiments of the present invention. The timing diagram in FIG. 3 demonstrates why the condition data about the capacitance of the probe pins and board on the tester is required.

As shown in FIG. 3, CLK designates a clock signal; IN designates an input test pattern; OUT1 designates an output expectation value output under the best operating conditions (hereinafter referred to as "best case"); and OUT2 designates an output expectation value output under the worst operating conditions (hereinafter referred to as "worst case").

When the operating condition is the best case, the corresponding output expectation value OUT1 can be obtained in the same cycle as the test pattern input cycle. As shown in FIG. 3, in the case of OUT1, the output data B1 for the input test data A1 can be obtained during the same cycle.

When the operating condition is the worst case, the corresponding output expectation value OUT2 cannot be obtained in the same cycle as the test pattern input cycle, and the output data OUT2 is obtained during the next cycle. As shown in FIG. 3, in the case of OUT2, the output data B1 for the input test data Al can be obtained during the next cycle.

As described above, delay of input data is different depending on the operating conditions. Therefore, it is necessary to detect an accurate amount of delay of the input data under the respective operating conditions.

Referring to FIG. 2, an expectation value selecting device 7 selects an output expectation value to be verified at the time of high-speed operation (actual operation) test. That is, the expectation value selecting device 7 selects an output expectation value to be compared with an output result of the LSI. An expectation value inserting device 8 stops the clock signal CLK for a predetermined period. An expectation value converting device 9 replaces the output expectation value with a "don't care" pattern (i.e., an X pattern) indicating that the output expectation value can be either a logical "1" or "0". An expectation value setting device 10 sets the predetermined output expectation value to the output expectation value selected by the expectation value selecting device 7.

The expectation value selecting device 7, expectation value inserting device 8, expectation value converting device 9 and expectation value setting device 10 will be described in detail hereinbelow.

The high-speed operation verifying test data 3 is capable of testing the high-speed operation (actual operation) of an LSI with the automatic test equipment (ATE).

A first preferred embodiment of the present invention will now be described below with reference to FIGS. 4A and 4B. In accordance with the first preferred embodiment of the present invention, the circuit illustrated in FIG. 4A generates high-speed operation verifying test data.

Figure 4A:
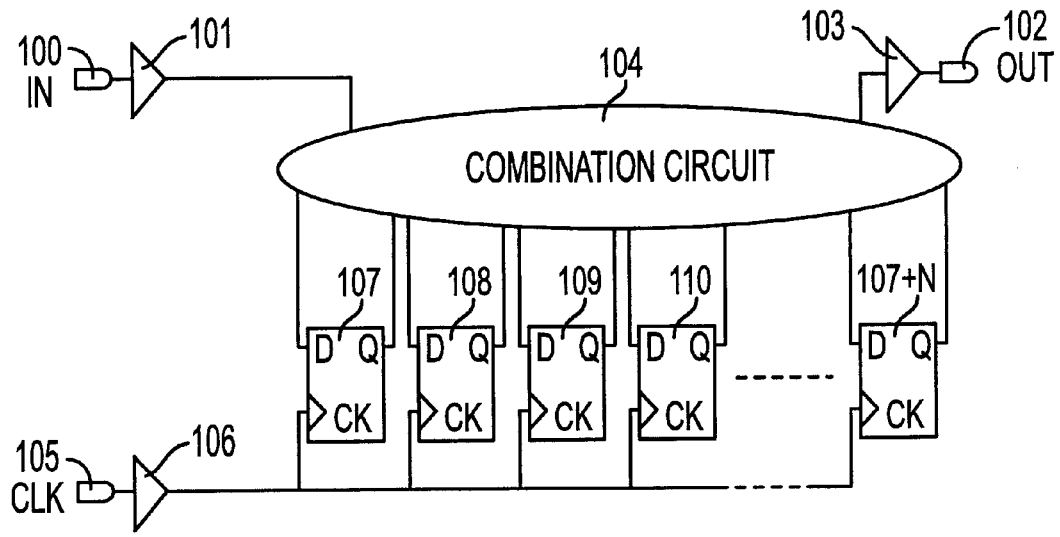
FIG. 4A is a high-speed operation verifying test data generation circuit in accordance with a first preferred embodiment of the present invention.

The high-speed operation verifying test data generation circuit illustrated in FIG. 4A comprises a data input terminal 100, an input buffer 101, an output terminal 102, an output buffer 103, a combination circuit 104, a clock terminal 105, a clock buffer 106, and a plurality of flip-flop FF circuits (FF 107, FF 108, ..., FF 107+N, where N is a positive integer). The circuit illustrated in FIG. 4A is a simplified circuit diagram. Generally, in accordance with the present invention, the high-speed operation verifying test data generation circuit includes a plurality of data input terminals 100, input buffers 101, output buffers 103 and output terminals 102. Moreover, the combination circuit 104 is shown in FIG. 4A as only one circuit. However, the combination circuit 104 may include a plurality of combination circuits 104.

A clock signal CLK is supplied to the clock terminal 105 from outside of the chip being tested and the clock signal is supplied to each FF (FF 107 to FF 107+N) from the clock terminal 105.

Figure 4B:
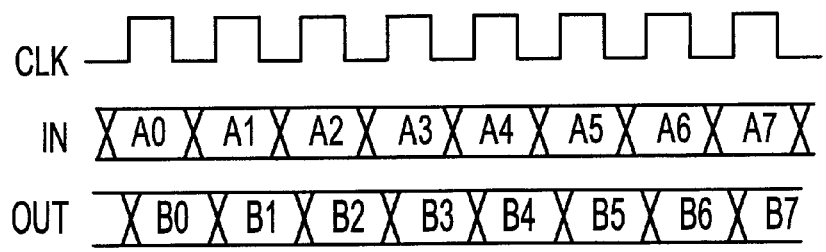
FIG. 4B is a timing diagram of the simulation data generated by the circuit shown in FIG. 4A in accordance with the first preferred embodiment of the present invention.

FIG. 4B illustrates the simulation data generated by the circuit shown in FIG. 4A in accordance with the first preferred embodiment of the present invention. As shown in FIG. 4B, CLK designates a clock signal; IN designates an input test pattern; and OUT designates an output expectation value. In performing a simulation operation, the LSI is tested by inputting the test pattern described in the input test pattern IN to the input terminal 100 and comparing the pattern output from the output terminal 102 of the LSI with the output expectation value OUT. In accordance with the first preferred embodiment of the invention, it is a precondition that the low-speed operation of the LSI is normally tested with the simulation data illustrated in FIG. 4B by the tester (ATE).

The high-speed operation verifying test data is generated based on the simulation data shown in FIG. 4B in accordance with the flow of the semiconductor test data generating system illustrated in FIG. 2.

FIGS. 5A–5E are timing diagrams illustrating respective operations performed by the devices of the test data generating system shown in FIG. 2.

Figure 5A:
FIGS. 5A–5E are timing diagrams illustrating respective operations performed by the devices shown in FIG. 2 in accordance with the first preferred embodiment of the present invention.

FIG. 5A is a timing diagram illustrating an operation performed by the expectation value selecting device 7 in accordance with the first preferred embodiment. The expectation value selecting device 7 selects the output expectation value OUT to be verified (that is, the output expectation value to be compared with the output result of the LSI) at the time of high-speed operation test (actual operation test). The output expectation value OUT can be freely selected. In accordance with the first preferred embodiment of the invention, the output expectation value OUT is selected at a constant interval, specifically, at every constant number of cycles. As shown in FIG. 5A, the output expectation value OUT to be verified is selected every three cycles, and the selected output expectation value OUT is B2, B5, B8, . . .

Figure 5B:
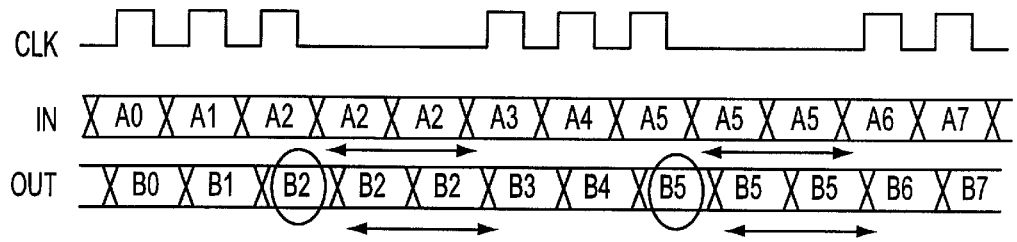

FIG. 5B illustrates the operation performed by the expectation value inserting device 8 in accordance with the first preferred embodiment of the invention. As shown in FIG. 5B, the expectation value inserting device 8 stops the clock signal CLK for a predetermined period. The predetermined period for stopping the clock signal CLK is referred to as the number of stop cycles. In accordance with the first preferred embodiment of the invention, the number of stop cycles is equal to a value obtained by subtracting one (1) from the constant number of cycles in which the output expectation value is selected.

When the clock signal is stopped, a change of signal conditions in the LSI also stops. Therefore, the output expectation value OUT and input pattern IN do not change during the predetermined period during which the clock signal is stopped. That is, the output expectation value OUT and the input pattern IN do not change during a time period equal to the number of stop cycles passing after the clock signal stops. The output expectation value OUT and input pattern IN when the clock signal CLK stops are maintained unchanged. Therefore, the same output expectation value OUT is inserted for the number of stop cycles immediately after the selected output expectation value OUT. Moreover, the same input pattern IN is inserted for the number of stop cycles immediately after the input pattern IN corresponding to the selected output expectation value.

The number of stop cycles corresponds to a delay during the period until the output signal corresponding to the input signal is output. Because the delay of the output signal depends on various conditions during the test period, the output signal corresponding to the input signal cannot be obtained during the predetermined cycle. Therefore, the output signal corresponding to the input signal can be obtained by stopping the clock for the period equal to the delay of the output signal (i.e., by stopping the change of signal conditions in the LSI). The number of stop cycles is determined by the information (condition data) from the condition data file 2.

As shown in FIG. 5B, the clock signal CLK is changed such that it is stopped for two cycles after every three cycles of operation. The same output expectation value B2 is inserted in the output expectation value OUT twice after the selected output expectation value B2, and the same output expectation value B5 is inserted twice after the selected output expectation value B5. The same input pattern A2 is inserted in the input pattern IN twice after the input pattern A2 corresponding to the selected output expectation value, and the same input pattern A5 is inserted twice after the input pattern A5 corresponding to the selected output expectation value.

Figure 5C:
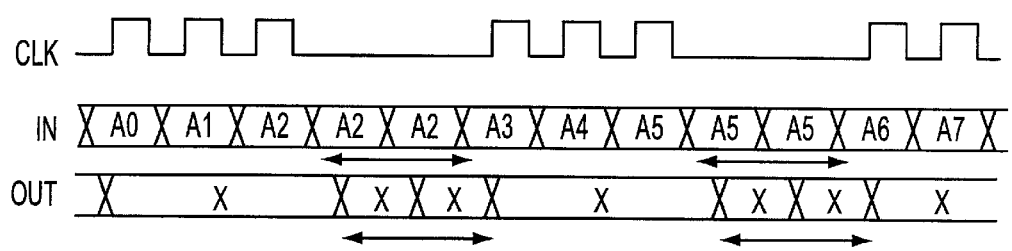

FIG. 5C illustrates the operation performed by the expectation value converting device 9 in accordance with embodiments of the present invention. The expectation value converting device 9 replaces the output expectation value OUT with a "don't care" pattern (X pattern).

Figure 5D:
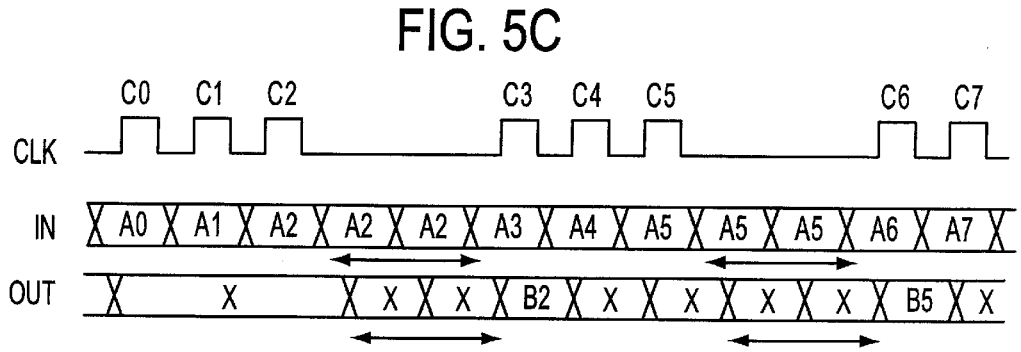
Figure 5E:
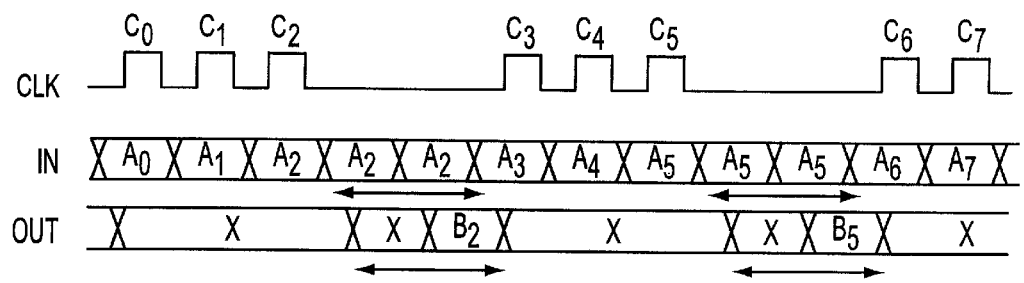

FIG. 5D and FIG. 5E illustrate the operation performed by the expectation value setting device 10 in accordance with embodiments of the present invention. The expectation value setting device 10 sets the predetermined output expectation value to the output expectation value selected by the expectation value selecting device 7.

The output expectation value to which the selected output expectation value should be set differs depending on the setting of the strobe timing. The strobe timing is the timing for comparing the output expectation value with an output result of the LSI. The strobe timing to be set during one cycle can be classified into the following two cases. In a first case, the strobe timing is set preceding the leading edge of the clock cycle. In a second case, the strobe timing is set after the leading edge of clock cycle.

The two cases for setting strobe timing will be explained in more detail below. Setting of the strobe timing preceding the leading edge of the clock signal CLK will be described first below with reference to FIGS. 6A and 6B.

Figure 6A:
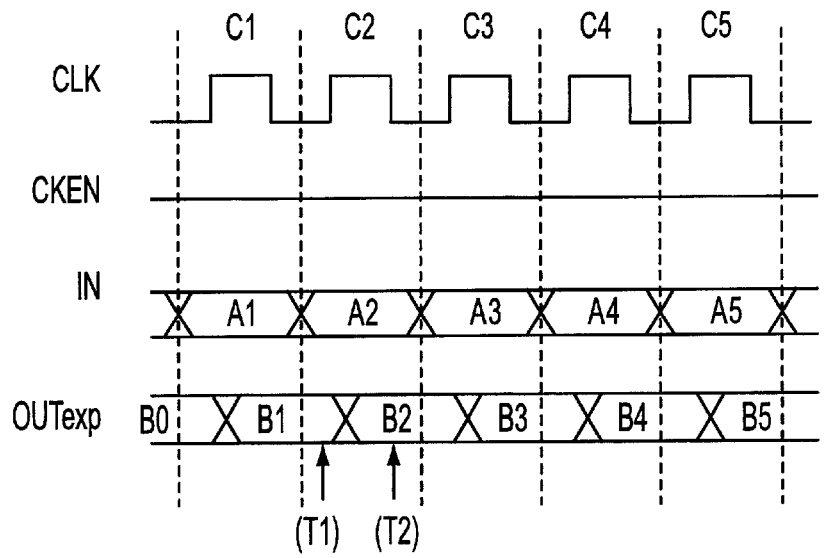
FIGS. 6A and 6B are diagrams illustrating the setting of strobe timing in accordance with the first preferred embodiment of the present invention.
Figure 6B:
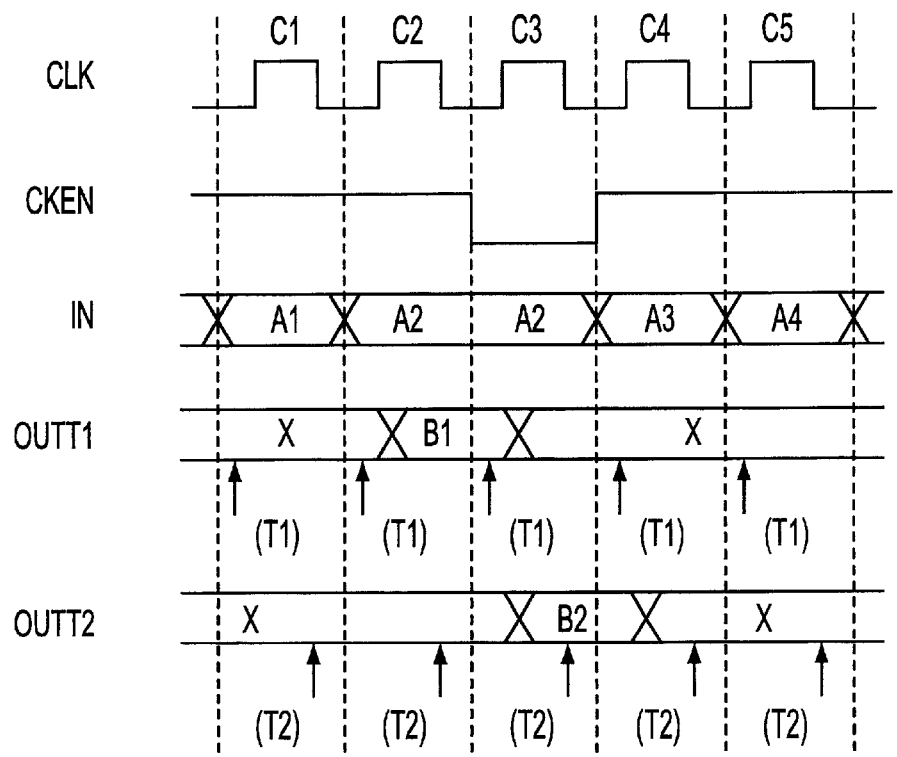

As shown in FIG. 6A and FIG. 6B, the strobe timing preceding the leading edge of the clock signal CLK is indicated by T1. The strobe timing T1 is set preceding the rising edge, which is the leading edge, of the clock signal CLK. As shown in FIG. 6A, the input pattern A2 of cycle C2 is not yet read at the strobe timing T1. Therefore, the output expectation value OUT does not change, and is maintained as the output expectation value B1 corresponding to the input pattern A1 of the preceding cycle C1.

As shown in FIG. 6B, the clock signal of the third cycle is stopped. More particularly, in FIGS. 6A and 6B, CKEN designates a signal input to a high-speed operation verifying control terminal (clock enable terminal) having the role to stop the clock signal.

As described above, the output expectation value at the strobe timing T1 corresponds to the input pattern of the preceding cycle. Therefore, the output expectation value (i.e., the output expectation value to be compared with the output result of the LSI) obtained at the strobe timing T1 during the period when the clock is in the stop condition is B1. In this case, the high-speed operation verifying test data becomes OUTT1, as shown in FIG. 6B.

Setting of the strobe timing after the leading edge of the clock signal CLK will now be described with reference to FIGS. 6A and 6B. As shown in FIG. 6A, the strobe timing after the leading edge of the clock signal is indicated as T2. The strobe timing T2 is set after the rising edge, which is the leading edge, of the clock signal CLK. At the strobe timing T2, the input pattern of the cycle C2 is already read. Therefore, the output expectation value is changed to the output expectation value B2 corresponding to the input pattern A2 of cycle C2 from the output expectation value B1 corresponding to the input pattern A1 of the preceding cycle C1.

The output expectation value at the strobe timing T2 corresponds to the input pattern of the current cycle (i.e., cycle at the strobe timing). Therefore, the output expectation value (output expectation value to be compared with the output result of the LSI) obtained at the strobe timing T2 during the period when the clock signal is in the stop condition is B2. In this case, the high-speed operation verifying test data becomes OUTT2, as shown in FIG. 6B.

As described above, the high-speed operation verifying test data is different depending on different setting of the strobe timing. The principle illustrated in FIG. 6A and FIG. 6B must be reflected on generation of the high-speed operation verifying test data.

FIG. 5D illustrates the setting of the output expectation value when the strobe timing is set preceding the leading edge of the clock signal. FIG. 5E illustrates the setting of the output expectation value when the strobe timing is set after the leading edge of the clock signal.

As shown in FIG. 5D, the output expectation value at the strobe timing is the output expectation value B1 corresponding to the input pattern A1 of the preceding cycle C1. Therefore, the output expectation value at the strobe timing in the period where the clock signal is in the stop condition is considered to be B1, and the output expectation value at the strobe timing during the cycle C3 after the clock signal is in the stop condition becomes B2. Therefore, the output expectation value corresponding to the cycle C3 after the clock signal is in the stop condition is set to the output expectation value B2 selected by the expectation value selecting device 7. As shown in FIG. 5D, the output expectation value corresponding to the cycle C3 is set to B2 and the output expectation value corresponding to the cycle C6 is set to B5.

As shown in FIG. 5E, the output expectation value at the strobe timing is B2 corresponding to the input pattern A2 of the current cycle C2 (i.e., cycle at time of strobe timing). Therefore, the output expectation value at the strobe timing during the period where the clock signal is in the stop condition is considered to be B2.

Therefore, the output expectation value corresponding to the last cycle during the period where the clock signal is in the stop condition is set to the output expectation value B2 selected by the expectation value selecting device 7. As shown in FIG. 5E, the output expectation value corresponding to the cycle C2 is set to B2, and the output expectation value corresponding to the cycle C5 is set to B5.

In accordance with the first preferred embodiment of the present invention, after all output expectation values are replaced with the don't care pattern (X pattern), the predetermined output expectation value is set to the selected output expectation value. However, it is also possible to perform the process for setting the predetermined output expectation value to the selected expectation value first, and to thereafter perform the process for converting the other expectation values to the X pattern. That is, the sequence of operation of the expectation value converting device 9 and expectation value setting device 10 are interchanged.

A second preferred embodiment of the present invention will now be described below with reference to FIG. 7A. In accordance with the second preferred embodiment of the present invention, the circuit shown in FIG. 7A generates high-speed operation verifying test data. The circuit shown in FIG. 7A generates the high-speed operation verifying test data in the case that the strobe timing is set after the leading edge of the clock.

The operation for generating the high-speed operation verifying test data in accordance with the second preferred embodiment of the present invention is same as the operation for generating the high-speed operation verifying test data in accordance with the first preferred embodiment of the invention. More specifically, the high-speed operation 20 verifying test data is generated by the operation of the test data generating system illustrated in FIG. 2.

Figure 7A:
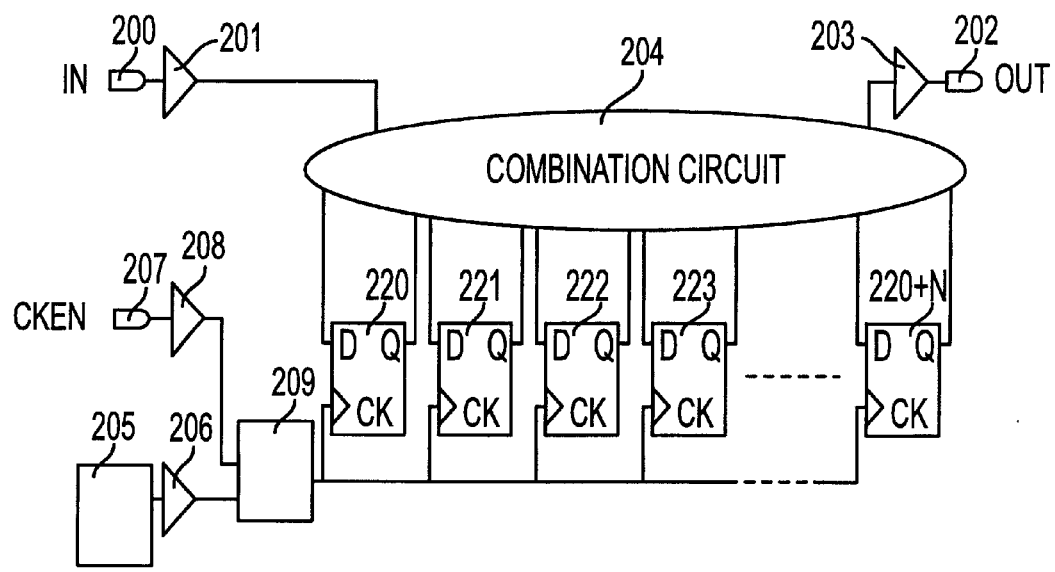
FIGS. 7A and 7B illustrate the high speed operation verifying test data generation circuit in accordance with a second preferred embodiment of the present invention.

In accordance with the second preferred embodiment of the present invention shown in FIG. 7A, the clock signal is generated within the chip and is then supplied. In contrast, in accordance with the first preferred embodiment of the present invention shown in FIG. 4A, the clock signal is supplied from the outside of the chip. More specifically, in accordance with the first preferred embodiment of the present invention, the control for stopping the clock signal for the predetermined period is executed easily from externally of the chip.

However, in accordance with the second preferred embodiment of the present invention, the control for stopping the clock signal for the predetermined period is not executed from externally of the chip. Therefore, in accordance with the second preferred embodiment of the present invention, a high-speed operation verifying control terminal (i.e., a clock enable terminal) and a system clock control circuit are provided within the chip in order to control the clock signal.

As shown in FIG. 7A, the high-speed operation verifying test data generating circuit comprises a data input terminal 200 (IN), an input buffer 201, an output terminal 202 (OUT), an output buffer 203, a combination circuit 204, a clock generator 205, a clock buffer 206, a high-speed operation verifying control terminal 207 (CKEN) (i.e., a clock enable terminal), a clock buffer 208, a system clock control circuit 209 and a plurality of flip-flop FF circuits (FF 220, FF 221 , . . . , FF 220+N, where N is a positive integer). The circuit illustrated in FIG. 7A is a simplified representation. However, in accordance with embodiments of the present 20 invention, the high-speed operation verifying test data generating circuit preferably comprises a plurality of data input terminals 200, input buffers 201, output buffers 203 and output terminals 202. Moreover, the combination circuit 204 is also represented by only one circuit for convenience. However, the combination circuit 204 may comprise a plurality of combination circuits.

In accordance with the second preferred embodiment of the present invention, an enable signal (a "1" signal) is supplied to the high-speed operation verifying control terminal 207 (clock enable terminal) for operating the clock signal and a disable signal (a "0" signal) is supplied to the high-speed operation verifying control terminal 207 for stopping the clock signal.

Figure 7B:
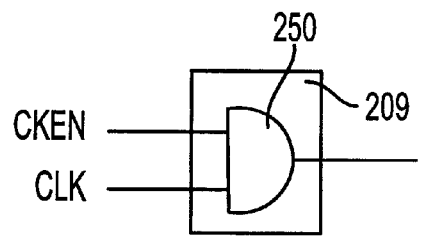

FIG. 7B illustrates the system clock control circuit 209 in accordance with the second preferred embodiment of the present invention. The system clock control circuit 209 comprises an AND gate 250 with two input terminals and one output terminal. The high speed operation verifying control signal (clock enable signal) CKEN is supplied to one input terminal of AND gate 250, and the clock signal CLK is supplied to the other input terminal. When the high-speed operation verifying control signal CKEN is a disable signal (a "0" signal), a "0" signal is output from the output terminal of the AND gate 250, that is, from the output terminal of the system clock control circuit 209, without relation to content of the clock signal CLK. When the enable signal is a "0" signal and the disable signal is a "1" signal, an OR gate is used in the system clock control circuit 209.

Figure 8A:
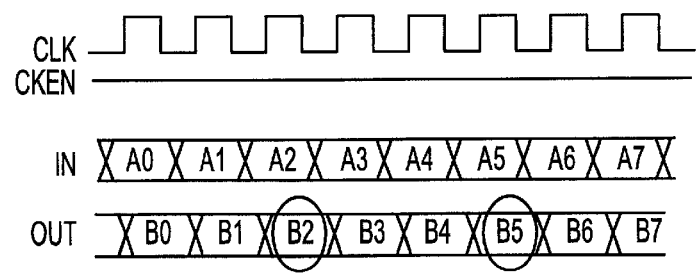
FIG. 8A illustrates simulation data of the circuit shown in FIG. 7A in accordance with the second preferred embodiment of the present invention.

FIG. 8A illustrates simulation data of the circuit shown in FIG. 7A in accordance with the second preferred embodiment of the invention. The simulation data shown in FIG. 8A is almost identical to the simulation data shown in FIG. 4B in accordance with the first preferred embodiment, except the simulation data of the second preferred embodiment includes a high-speed operation verifying control signal CKEN. As shown in FIG. 8A, because the clock signal CLK is always operating in the simulation data, the enable signal ("1" signal) is supplied as the high-speed operation verifying control signal CKEN (clock enable terminal) to operate the clock signal.

Figure 8B:
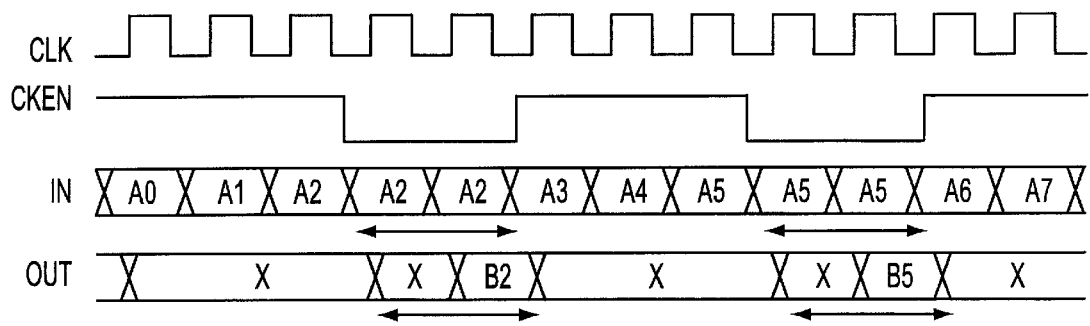
FIG. 8B illustrates high-speed operation verifying test data in accordance with the second preferred embodiment of the present invention.

FIG. 8B illustrates the high-speed operation verifying test data of the circuit shown in FIG. 7A in accordance with the second preferred embodiment of the invention. The data shown in FIG. 8B is almost identical to the high-speed operation verifying test data generated by the first preferred embodiment of the present invention, as shown in FIG. SE. The highy-speed operation verifying test data of the second preferred embodiment is different from the high-speed operation verifying test data of the first preferred embodiment of the present invention in that the data includes a high-speed operation verifying control signal CKEN (clock enable signal). In the high-speed operation verifying test data, the enable signal ("1" signal) is supplied to the high-speed operation verifying control terminal 207 (clock enable terminal) during the period when the clock signal CLK is in the operating condition and the disable signal ("0" signal) is supplied to the high-speed operation verifying control terminal 207 during the period when the clock signal is in the stop condition.

A third preferred embodiment of the present invention will now be described below with reference FIGS. 9A and 9B. In accordance with the third preferred embodiment of the present invention, the circuit shown in FIG. 9A generates the high-speed operation verifying test data. Moreover, the high-speed operation verifying test data is generated in the case that the strobe timing is set after the leading edge of the clock signal.

The operation to generate the high-speed operation verifying test data in accordance with the third preferred embodiment of the present invention is identical to the operation to generate the high-speed operation verifying test data in accordance with the first preferred embodiment of the present invention. That is, the high-speed operation verifying test data is generated in accordance with the operation of the test data generation system illustrated in FIG. 2.

Figure 9A:
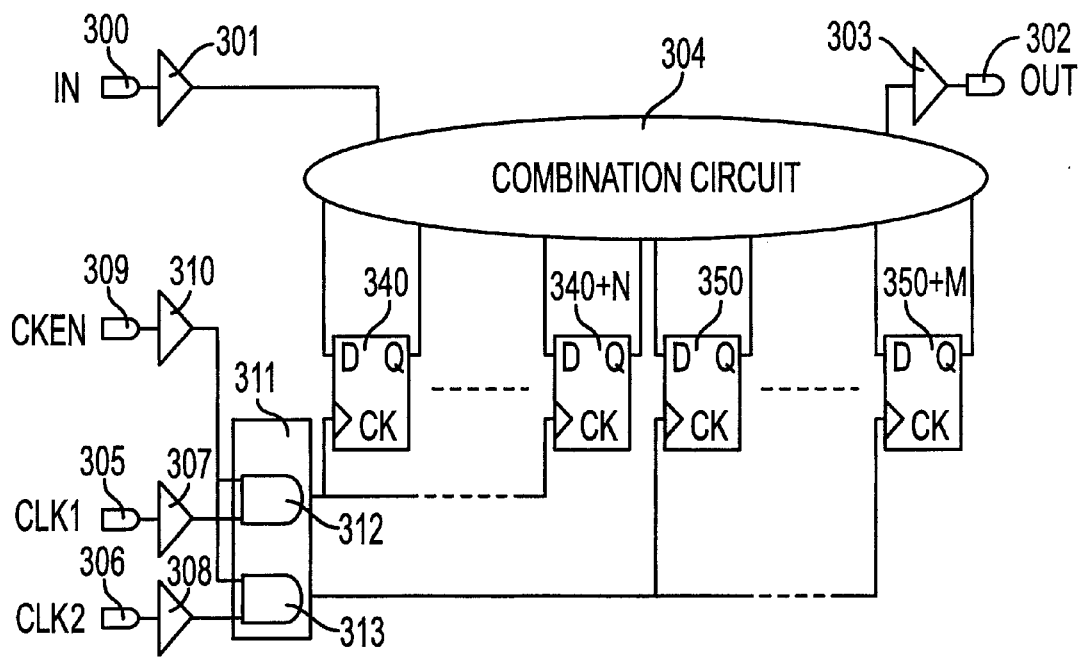
FIG. 9A illustrate a high-speed operation verifying test data generation circuit in accordance with a third preferred embodiment of the present invention.
Figure 9B:
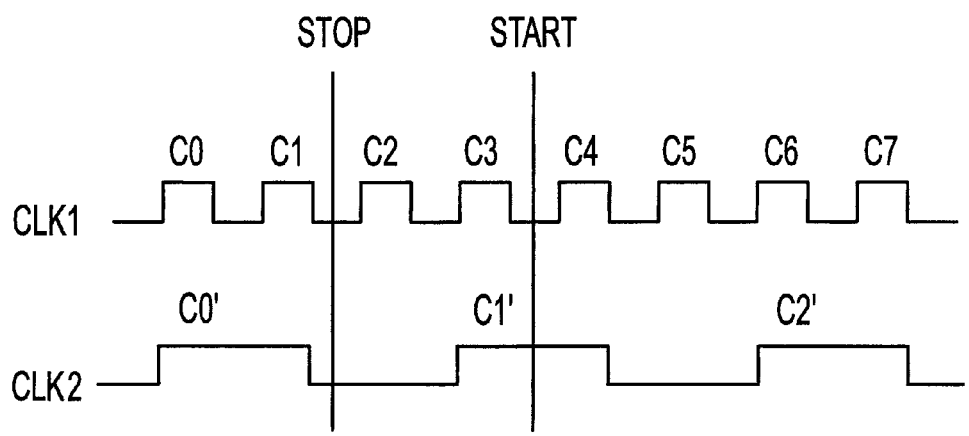
FIG. 9B illustrates the setting of the period to stop the clock signal in accordance with the third preferred embodiment of the present invention.

However, in accordance with the third preferred embodiment of the present invention, a plurality of clock signals CLK1, CLK2 are supplied to the high-speed operation verifying test data generating circuit shown in FIG. 9A from the outside of the chip. In contrast, the circuit in accordance with the first preferred embodiment of the invention (circuit of FIG. 4A) has one clock signal supplied from the outside of the chip. Therefore, the period to stop the clock signal is limited. Limitation on setting of the period to stop the clock signal will be described below after explanation of the high-speed operation verifying test data generation circuit in accordance with the third preferred embodiment of the present invention.

As shown in FIG. 9A, the high-speed operation verifying test data generating circuit comprises a data input terminal 300, an input buffer 301, an output terminal 302, an output buffer 303, a combination circuit 304, a first clock terminal 305, a second clock terminal 306, a first clock buffer 307, a second clock buffer 308, a high-speed operation verifying control terminal (clock enable terminal) 309, a third clock buffer 310, a system clock control circuit 311, a first AND gate 312 and a second AND gate 313 forming the system clock control circuit 311, a plurality of first flip-flops FF (FF 340, FF 341, . . . , FF 340+N, where N is a positive integer) and a plurality of second flip-flops FF (FF 350, FF 351, . . . , FF 350+N, where N is a positive integer). The circuit shown in FIG. 9A is a simplified representation. However, the high-speed operation verifying test data generating circuit in accordance with the third preferred embodiment generally comprises a plurality of input terminals 300, input buffers 301, output buffers 303 and output terminals 302. Moreover, the one combination circuit 304 shown in FIG. 9A represents all circuits included in the combination circuit 304.

In accordance with the third preferred embodiment of the present invention, the plurality of clock signals CLK1, CLK2 are supplied from an external circuit. However, the plurality of clock signals must be stopped simultaneously. Therefore, in a manner similar to the second preferred embodiment of the present invention, the high-speed operation verifying control terminal (clock enable terminal) 309 and system clock control circuit 311 are provided within a chip to control the clock signals. The system clock control circuit 311 comprises a plurality of AND gates 312, 313 to control the plurality of clock signals.

In accordance with the third preferred embodiment of the present invention, an enable signal ("1" signal) is supplied to the high-speed operation verifying control terminal 309 (clock enable terminal) to operate the clock signals, while a disable signal ("0" signal) is supplied to the high-speed operation verifying control terminal 309 to stop the clock signals.

Limitation on setting of the period to stop the clock signal will now be described below with reference to FIG. 9B. As shown in FIG. 9B, the first clock signal CLK1 and the second clock signal CLK2 have different clock cycles. The first clock signal CLK1 is stopped from the cycle C2 for as many as two cycles. The second clock signal CLK2 stops at a certain point A of the C0' cycle and starts operation from a certain point B in the course of the next C1' cycle (point B where one cycle does not yet pass from a certain point A). This phenomenon is generated because the system clock control circuit 311 is controlled to stop continuous output of the clock signal by receiving the clock enable signal instead of stopping the clock signal itself. Therefore, the cycle of the second clock signal CLK2 changes after the clock signal starts, and the internal condition of the chip differs from the case where the clock signal is operated continuously without stop condition. The timing for re-starting the clock signal must be located at a point isolated as much as integer cycles from the stop point. That is, re-starting of the clock signal must be made from the point in the same condition as the stop condition. Therefore, the period to stop the clock signal must be set to the least common multiple of the first clock signal CLK1 and the second clock signal CLK2.

Figure 10A:
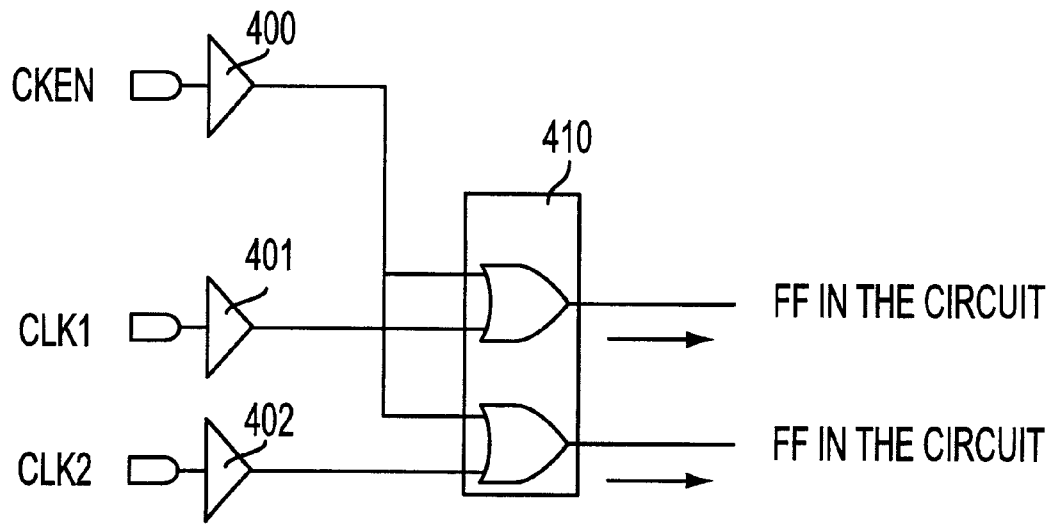
FIGS. 10A and 10B illustrate system clock control circuits in accordance with embodiments of the present invention.
Figure 10B:
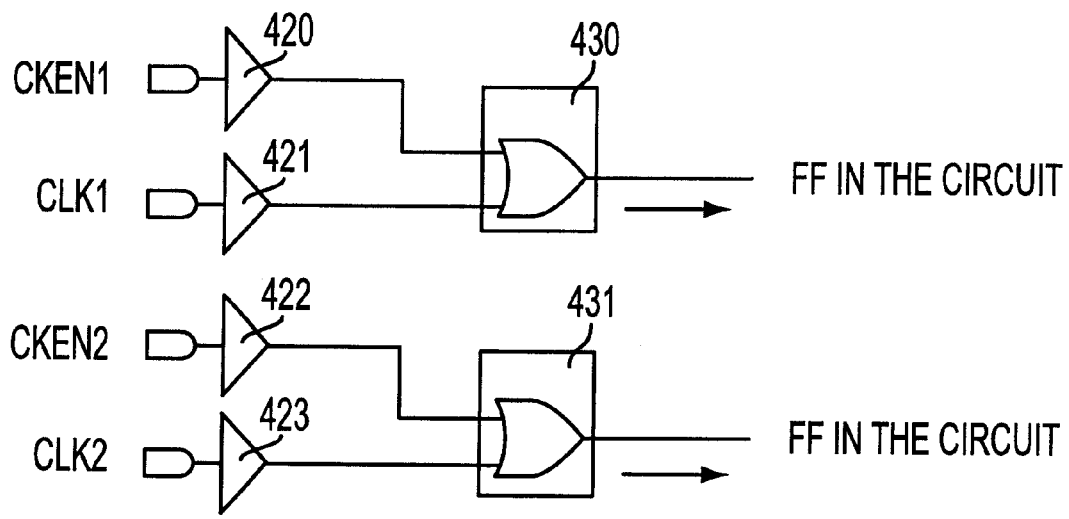

FIG. 10A and FIG. 10B illustrate other practical circuit configurations of a system clock control circuit in accordance with embodiments of the present invention wherein a plurality of clock signals are supplied from the outside of the chip.

In the circuit shown in FIG. 9A, the system clock control circuit 311 is formed of two AND gates 312, 313, each AND gate having two inputs and one output. The AND gates 312, 313 are assigned to clock terminals 305, 306, respectively. The respective outputs of the AND gates 312, 313 are outputs of the system clock control circuit 311, which outputs are supplied to respective groups of flip-flops FF 340, . . . 340+M and 350, . . . , 350+N. In each AND gate 312, 313, the high-speed operation verifying control signal CKEN (clock enable signal) is supplied to one input terminal and the clock signal CLK1, CLK2 is supplied to the other input terminal. When the high-speed operation verifying control signal CKEN is a disable signal ("0" signal), the signal "0" is always output from the output of the AND gate without relation to content of the clock signal. The system clock control circuits 410, 430, 431 illustrated in FIG. 10A and FIG. 10B formed of an OR gate with two inputs and one output. As shown in FIG. 10A, the system clock control circuit 410 is formed of a plurality of OR gates. The OR gate is employed when the enable signal is a "0" signal and the disable signal is a "1" signal. The high-speed operation verifying control signal CKEN (clock enable signal) is supplied to one input terminal of the respective OR gates, and the clock signals CLK1, CLK2 to the other input terminal of respective OR gates. When the high-speed operation verifying control signal CKEN (clock enable signal) is the disable signal ("1" signal), the signal "1" is always output from the output of the OR gate without relation to content of the clock signal.

As shown in FIG. 10B, each respective system clock control circuit 430, 431 is formed of one OR gate. The system clock control circuits 430, 431 respectively receive inputs from high-speed operation verifying control terminals CKEN1 and CKEN2 (clock enable terminal) and clock signals CLK1 and CLK2.

In the system clock control circuit illustrated in FIG. 10B, when the high-speed operation verifying control terminal (clock enable terminal) is separate from the clock terminal, a large delay is generated in propagation of the high-speed operation verifying control signal (clock enable signal) CKEN1, CKEN2. Therefore, the system clock control circuits 430, 431 and high-speed operation verifying control terminals (clock enable terminal) are assigned to each clock signal to reduce propagation delay.

Figure 11A:
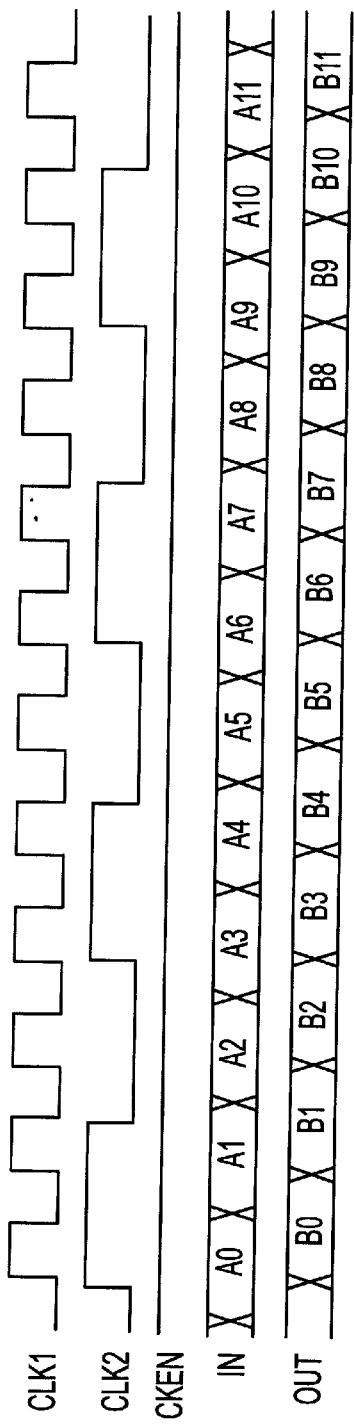
FIG. 11A illustrates simulation data of the circuit shown in FIG. 9A in accordance with the third preferred embodiment of the present invention.

FIG. 11A illustrates simulation data of the circuit shown in FIG. 9A in accordance with embodiments of the present invention. The simulation data is almost identical to the simulation data shown in FIG. 4B in accordance with the first preferred embodiment of the present invention. The simulation data shown in FIG. 11A differs from the simulation data of the first embodiment of the present invention shown in FIG. 4B in that a plurality of clock signals are used (CLK1, CLK2) and the high speed operation verifying control signal CKEN (clock enable signal) is used.

In the simulation data shown in FIG. 11A, the clock enable signal CKEN (signal "1") for operating the clock signal is supplied to the high-speed operation verifying control terminal 309 (clock enable terminal).

Figure 11B:
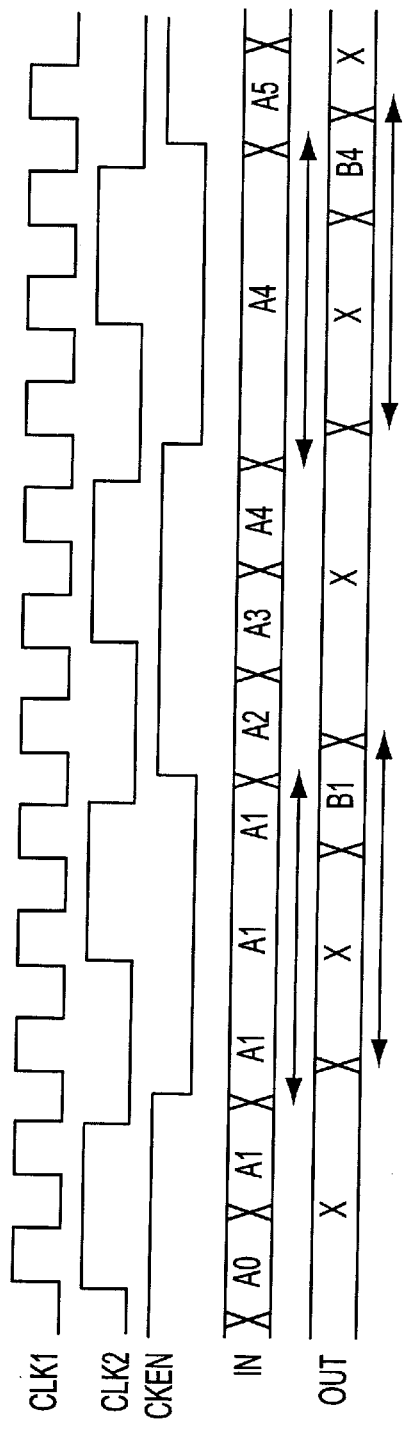
FIG. 11B illustrates high-speed operation verifying test data generated by the circuit shown in FIG. 9A in accordance with the third preferred embodiment of the present invention.

FIG. 11B illustrates the high-speed operation verifying test data of the circuit shown in FIG. 9A. The high-speed operation verifying test data is almost identical to the high-speed operation verifying test data generated in accordance with the first embodiment of the present invention, as shown in FIG. 5E. The difference between the high-speed operation verifying test data shown in FIG. 11B and the high-speed operation verifying test data of the first embodiment of the present invention is that a plurality of clock signals (CLK1, CLK2) are used and the high-speed operation verifying control signal CKEN (clock enable signal) is added.

The period to stop the clock signal is set to the least common multiple of the cycle of first clock signal CLK1 and the cycle of second clock signal CLK2. Specifically, since the cycle of second clock signal CLK2 is three times the cycle of the first clock signal CLK1, the period to stop the clock signal (least common multiple of the cycle of first clock signal CLK1 and the cycle of second clock signal CLK2) is identical to the cycle of the second clock signal CLK2.

In the high-speed operation verifying test data, the enable signal ("1" signal) is supplied to the high-speed operation verifying control terminal 309 (clock enable terminal) during the period to operate the clock, while the disable signal ("0" signal) is supplied to the high speed operation verifying control terminal 309 (clock enable terminal) during the period to stop the clock.

A fourth embodiment of the present invention will now be described below with reference to FIGS. 12A and 12B.

Figure 12A:
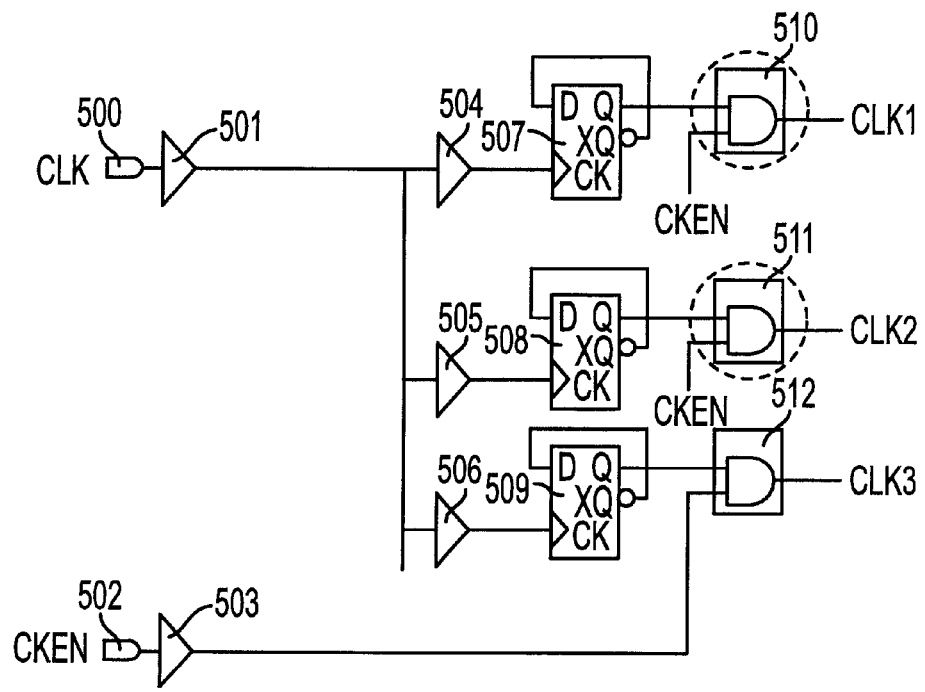
FIGS. 12A and 12B illustrate a high-speed operation verifying test data generating circuit in accordance with a fourth preferred embodiment of the present invention.
Figure 12B:
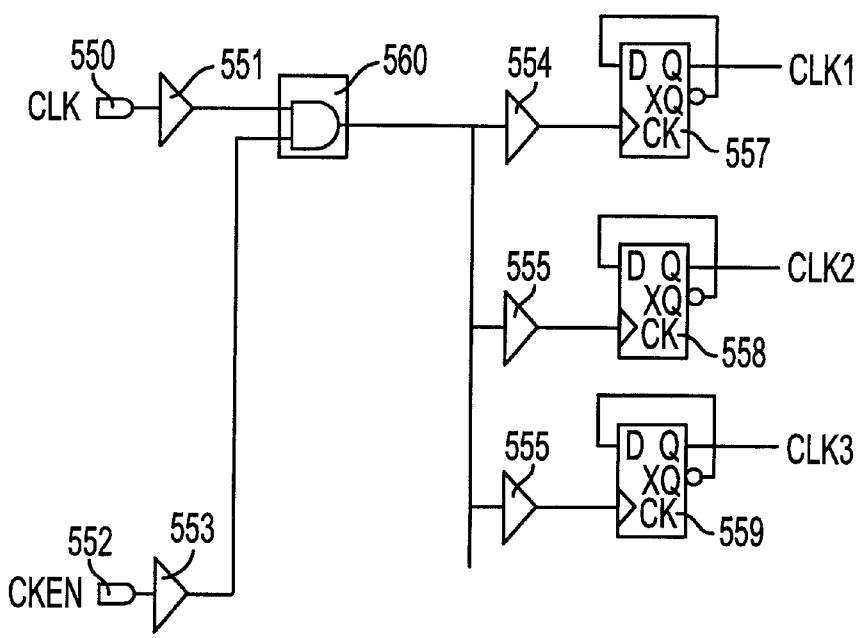

FIGS. 12A and 12B illustrate a high-speed operation verifying test data generating circuit including a clock signal input circuit in accordance with the fourth embodiment of the present invention.

Further, although not specifically illustrated in FIGS. 12A and 12B, the high-speed operation verifying test data generating circuit in accordance with the fourth embodiment includes a data input terminal, input buffer, output terminal, output buffer, combination circuit and a plurality of flip-flop FF circuits, which are identical to those described with respect to the other embodiments of the present invention. Moreover, the operation to generate the high-speed operation verifying test data in accordance with the fourth embodiment of the present invention is identical to the operation to generate the high-speed operation verifying test data described with respect to the first embodiment of the present invention (the high-speed operation verifying test data is generated by the flow of the test data generating system shown in FIG. 2). Therefore, description of simulation data and high speed operation verifying test data will not be repeated in detail in the description of the fourth embodiment of the present invention.

As shown in FIGS. 12A and 12B, in the high-speed operation verifying test data generating circuit in accordance with the fourth embodiment of the present invention, the frequency of a basic clock signal supplied from an external circuit is divided within the chip. In a manner similar to the circuit described with respect to the third embodiment of the present invention (FIG. 9A), a plurality of clock signals can be supplied within the chip. In view of simultaneously stopping a plurality of clock signals, it is required to provide a plurality of clock signals to the system clock control circuit and to provide high-speed operation verifying control terminal (clock enable terminal) to each of the plurality of clock signals, as described with respect to the third embodiment of the present invention.

In the circuit shown in FIG. 12A, the system clock control circuit is provided after a frequency divider. As shown in FIG. 12A, the circuit comprises a clock terminal 500, a clock buffer 501, a high-speed operation verifying control terminal (clock enable terminal) 502, clock buffers 503 to 506, frequency dividers 507 to 509, and system clock control circuits 510 to 512. The frequency dividers 507 to 509 are self-feedback type flip-flops FF. That is, flip-flops which feed back the data output XQ to the data input D.

In the circuit shown in FIG. 12A, setting of the period to stop the clock signal is limited as in the case of the circuit of the third embodiment of the present invention shown in FIG. 9A. Specifically, after completing the frequency division of the clock signal (converted to different clock signals), the clock signals are respectively stopped. Therefore, after the end of a stop period, it is required to operate the clock signals from the same condition as when the respective clocks are stopped, and the period to stop the clock signals must be the least common multiple of the cycles of a plurality of clock signals.

In the high-speed operation verifying test data generating circuit shown in FIG. 12B, a system clock control circuit 560 is provided after clock terminal 550 which supplies the basic clock signal. The circuit shown in FIG. 12B comprises a clock terminal 550, a clock buffer 551, a high-speed operation verifying control terminal (clock enable terminal) 552, clock buffers 553 to 556, frequency dividers 557 to 559 and the system clock control circuit 560.

In the circuit shown in FIG. 12B, there is no limitation on setting of the period to stop the clock signal. Since the basic clock signal before frequency division is stopped, adjustment for operating a plurality of clock signals from the same condition as the condition when the clock signals are stopped is no longer required.

Figure 13A:
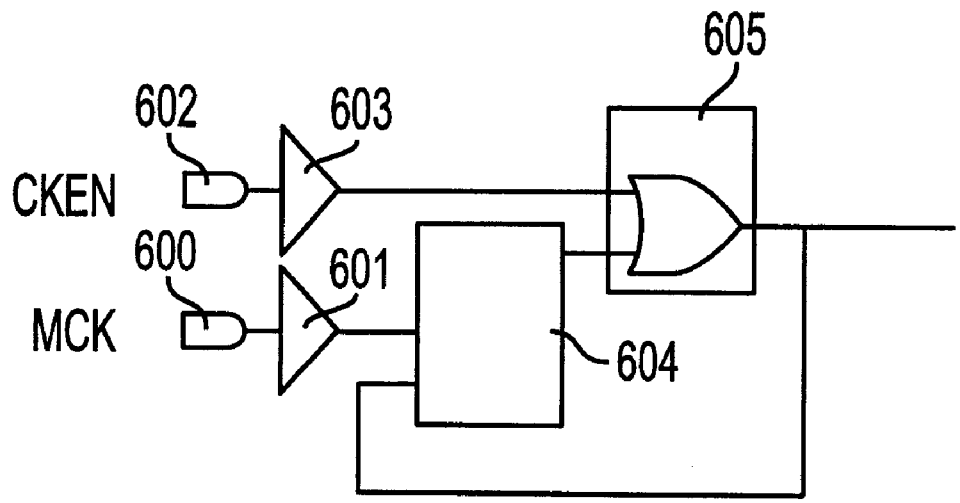
FIGS. 13A and 13B illustrate a high-speed operation verifying test data generating circuit in accordance with a fifth preferred embodiment of the present invention.
Figure 13B:
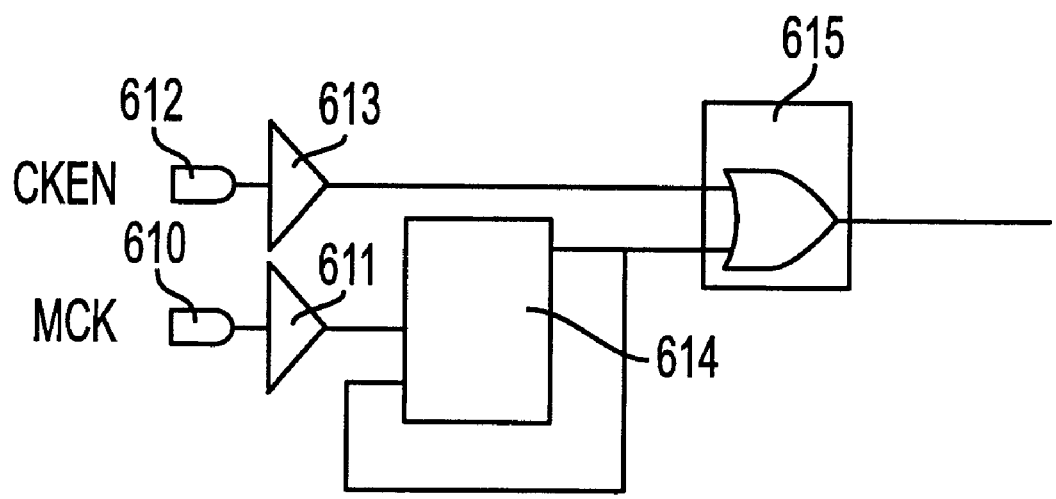

FIGS. 13A and 13B illustrate a high-speed operation verifying test data generating circuit including a clock signal input circuit in accordance with a fifth embodiment of the present invention.

The fifth embodiment of the present invention comprises a data input terminal, input buffer, output terminal, output buffer, combination circuit and a plurality of FF circuits which are identical to those of the other embodiments. Moreover, the operation to generate the high-speed operation verifying test data in accordance with the fifth embodiment of the present invention is identical to the operation to generate the high-speed operation verifying test data in accordance with the first embodiment of the present invention (the high-speed operation verifying test data is generated through the operation of the test data generating system of FIG. 2). Therefore, in accordance with the fifth embodiment of the present invention, a description of the simulation data and high speed operation verifying test data will not be repeated.

In accordance with the fifth embodiment of the present invention shown in FIG. 13A and FIG. 13B, it is impossible to control the clock signal itself from the external side because the clock signal input circuit comprises a phase locked loop (PLL). Therefore, the system clock control circuit and high-speed operation verifying control terminal (clock enable terminal) are provided as in the case of the second embodiment of the present invention in order to enable the control of the clock signal from the external circuit.

As shown in FIG. 13A, the circuit comprises a master clock terminal of PLL 600, a clock buffer 601, a high-speed operation verifying control terminal (clock enable terminal) 602, a clock buffer 603, a PLL 604 and a system clock control circuit 605.

In operation of the circuit shown in FIG. 13A, the clock signal output from the system clock control circuit 605 is used as the clock signal to be fed back to the PLL 604. Since the clock signal immediately before it which is supplied to the internal circuit is fed back to the PLL 604, the PLL 604 can generate the clock signal efficiently. However, since the clock signal to be fed back is stopped for a certain period, if the stop period is rather long, a possibility for generation of problems in the operation of PLL 604 occurs.

The circuit shown in FIG. 13B comprises a master clock terminal 610 of a PLL 614, a clock buffer 611, a high-speed operation verifying control terminal (clock enable terminal) 612, a clock buffer 613, the PLL 614 and a system clock control circuit 615.

In the circuit shown in FIG. 13B, the clock signal output from PLL 614 is used as the clock signal to be fed back to the PLL 614. Since the clock signal to be fed back is never stopped, there is no possibility for generation of a problem in the operation of PLL 614. However, the clock signal to be actually supplied to the internal circuit is never the clock signal itself output from the PLL 614 and the clock signal having passed the system clock control circuit 615. Therefore, in some cases, a certain influence may be generated in the accuracy of the clock signal generating operation of the PLL 614.

Therefore, in the case in which a PLL is used in the clock signal input circuit, it is required to determine which circuit of the circuits shown in FIG. 13A and FIG. 13B should be used by totally considering the accuracy of the PLL and signal propagation velocity or the like.

Although preferred embodiments of the present invention have been shown and described, it will be appreciated by those skilled in the art that changes may be made in these embodiments without departing from the principle and spirit of the invention, the scope of which is defined in the appended claims and their equivalents.

What is claimed is:

1. A test data generating method, comprising:
   selecting a first output expectation value from simulation data, the first output expectation value corresponding to an input value;
   inserting a predetermined number of output expectation values, which are identical to the first output expectation value, into the simulation data after the first output expectation value;
   inserting a predetermined number of input values into the simulation data, which are identical to the input value, after the input value corresponding to the first output expectation value;
   replacing the predetermined number of output expectation values of the simulation data with second output expectation values; and
   setting the first output expectation value to a third output expectation value selected from the second output expectation values to generate the test data.

2. The test data generating method as recited in claim 1, wherein the predetermined number is a number of cycles during which a clock signal is stopped.

3. The test data generating method as recited in claim 2, wherein the number of cycles to stop the clock signal is determined based on capacitance of elements of a tester.

4. The test data generating method as recited in claim 2, wherein the number of cycles to stop the clock signal is determined on the basis of the operating conditions of an LSI.

5. The test data generating method as recited in claim 2, wherein the third output expectation value corresponds to a last cycle in the number of cycles during which the clock signal is stopped.

6. The test data generating method as recited in claim 5, further comprising:
   generating a strobe timing after the leading edge of the clock signal.

7. The test data generating method as recited in claim 2, wherein the third output expectation value corresponds to clock cycles after the number of clock cycles during which the clock signal is stopped.

8. The test data generating method as recited in claim 7, further comprising:
   generating a strobe timing before the leading edge of the clock signal.

9. The test data generating method as recited in claim 1, wherein the second output expectation value is a don't care pattern.

10. The test data generating method as recited in claim 1, wherein the first output expectation value is selected for every predetermined cycle.

11. A computer readable storage medium encoded with processing instructions for performing test data generation with a computer, comprising:
    a selecting unit selecting a first output expectation value from simulation data, the first output expectation value corresponding to an input value;
    a first inserting unit inserting a predetermined number of output expectation values, which are identical to the first output expectation value into the simulation data, after the first output expectation value;
    a second inserting unit inserting a predetermined number of input values into the simulation data, which are identical to the input value, after the input values corresponding to the first output expectation value;
    a replacing unit replacing the predetermined number of output expectation values of the simulation data with second output expectation values; and
    a setting unit setting a third output expectation value selected from the second output expectation values to generate the test data.

12. The computer readable storage medium as recited in claim 11, wherein the predetermined number is a number of cycles during which a clock signal is stopped.

13. A computer readable storage medium encoded with processing instructions for implementing a test data generating method with a computer, the method comprising:
    selecting a first output expectation value from simulation data, the first output expectation value corresponding to an input value;
    inserting a predetermined number of output expectation values, which are identical to the first output expectation value into the simulation data, after the first output expectation value;
    inserting a predetermined number of input values into the simulation data, which are identical to the input value, after the input values corresponding to the first output expectation value;
    replacing the predetermined number of output expectation values of the simulation data with second output expectation values; and
    setting the first output expectation value to a third output expectation value selected from the second output expectation values to generate the test data.

14. The computer readable storage medium as recited in claim 13, wherein the predetermined number is a number of cycles during which a clock signal is stopped.

15. The computer readable storage medium as recited in claim 14, further comprising determining the number of cycles to stop the clock signal based on capacitance of elements of a tester.

16. The computer readable storage medium as recited in claim 14, further comprising determining the number of cycles to stop the clock signal on the basis of the operating conditions of an LSI.

17. The computer readable storage medium as recited in claim 14, wherein the third output expectation value corresponds to a last cycle in the number of cycles during which the clock signal is stopped.

18. The computer readable storage medium as recited in claim 17, further comprising:
    generating a strobe timing after the leading edge of the clock signal.

19. The computer readable storage medium as recited in claim 14, wherein the second output expectation value corresponds to clock cycles after the number of clock cycles during which the clock signal is stopped.

20. The computer readable storage medium as recited in claim 19, further comprising:
    generating a strobe timing before the leading edge of the clock signal.

21. The computer readable storage medium as recited in claim 13, wherein second output expectation value is a don't care pattern.

22. The computer readable storage medium as recited in claim 13, wherein the selecting further comprises selecting the first output expectation value for every predetermined cycle.

23. An apparatus, comprising:

a data storage device; and a processor connected to the data storage device, the data storage device storing a program for controlling the processor, and the processor operative with the program to:

select a first output expectation value from simulation data, the first output expectation value corresponding to an input value, insert a predetermined number of output expectation values, which are identical to the first output expectation value into the simulation data, after the first output expectation value, insert a predetermined number of input values into the simulation data, which are identical to the input value, after the input values corresponding to the first output expectation value, replace the predetermined number of output expectation values of the simulation data with second output expectation values, and set a third output expectation value determined from said simulation data to said first output expectation value selected from the second output expectation values to generate the test data.

24. A test data generating system, comprising:

a selecting device to select a first output expectation value from simulation data, the first output expectation value corresponding to an input value;

an inserting device to insert a predetermined number of output expectation values which are identical to the first output expectation value into the simulation data, after the first output expectation value and to insert a predetermined number of input values into the simulation data, which are identical to the input value, after the input value corresponding to the first output expectation;

a replacing device to replace the predetermined number of output expectation values of the simulation data with second output expectation values; and a setting device to set the first output expectation value to a third output expectation value selected from the second output expectation values to generate the test data.

* * * * *

UNITED STATES PATENT AND TRADEMARK OFFICE
CERTIFICATE OF CORRECTION

PATENT NO. : 6,715,119 B1
DATED : March 30, 2004
INVENTOR(S) : Hitoshi Watanabe

It is certified that error appears in the above-identified patent and that said Letters Patent is hereby corrected as shown below:

<u>Title page</u>,
Item [57], ABSTRACT,
Line 2, after "(actual operation" insert -- ) --.

Signed and Sealed this

Thirty-first Day of August, 2004

JON W. DUDAS
*Director of the United States Patent and Trademark Office*